United States Patent
Farooq et al.

(10) Patent No.: US 7,234,218 B2
(45) Date of Patent: Jun. 26, 2007

(54) METHOD FOR SEPARATING ELECTRONIC COMPONENT FROM ORGANIC BOARD

(75) Inventors: Mukta G. Farooq, Hopewell Junction, NY (US); Harvey C. Hamel, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 16 days.

(21) Appl. No.: 10/906,816

(22) Filed: Mar. 8, 2005

(65) Prior Publication Data

US 2006/0200965 A1 Sep. 14, 2006

(51) Int. Cl.
*B23P 19/02* (2006.01)

(52) U.S. Cl. .................. 29/426.4; 29/402.03; 29/426.1; 29/840; 219/56.22; 219/209; 219/635; 228/119; 228/264

(58) Field of Classification Search ............. 29/402.03, 29/402.08, 426.1, 426.4, 840; 219/56.1, 219/56.22, 85.1, 209, 530, 635, 656; 228/19, 228/119, 180.21, 264; 361/771, 785
See application file for complete search history.

(56) References Cited

U.S. PATENT DOCUMENTS

| | | | | |
|---|---|---|---|---|
| 4,582,975 | A | * | 4/1986 | Daughton .................... 219/209 |
| 4,769,525 | A | * | 9/1988 | Leatham ...................... 219/209 |
| 4,983,804 | A | * | 1/1991 | Chan et al. .................. 219/635 |
| 5,542,601 | A | | 8/1996 | Fallon et al. |
| 5,549,240 | A | * | 8/1996 | Urban .......................... 29/764 |
| 5,700,987 | A | * | 12/1997 | Basavanhally ............. 219/56.1 |
| 5,746,367 | A | * | 5/1998 | Pai et al. ...................... 228/19 |
| 5,862,588 | A | | 1/1999 | Heim et al. |
| 5,901,898 | A | * | 5/1999 | Strempke ..................... 228/19 |
| 5,954,978 | A | * | 9/1999 | Seelert et al. ............... 219/209 |
| 6,012,624 | A | | 1/2000 | French et al. |
| 6,031,729 | A | | 2/2000 | Berkely et al. |
| 6,068,175 | A | | 5/2000 | Heim et al. |
| 6,396,706 | B1 | | 5/2002 | Wohlfarth |
| 6,705,006 | B2 | | 3/2004 | Baechtle et al. |
| 2002/0112883 | A1 | | 8/2002 | Baechtle et al. |
| 2002/0170901 | A1 | | 11/2002 | Lau |
| 2003/0019918 | A1 | | 1/2003 | Farooq et al. |

OTHER PUBLICATIONS

*Separable Multilevel Thermal Connector*, IBM Technical Disclosure Bulletin, Apr. 1978, pp. 4776-4779.
*Method for Soldering/Unsoldering Heat Sensitive Parts*, IBM Technical Disclosure Bulletin, Oct. 1979, pp. 1827-1829.

\* cited by examiner

*Primary Examiner*—Minh Trinh
*Assistant Examiner*—Donghai D. Nguyen
(74) *Attorney, Agent, or Firm*—DeLio & Peterson, LLC; Kelly M. Nowak; Joseph Petrokaitis

(57) ABSTRACT

A method and electrical structure for separating electronic components from one another joined by solder interconnections. An electronic module is joined to a substrate via a solder interconnection, whereby the electronic module has an electrical heating component residing within a bottom layer thereof adjacent a solder interconnection. Preferably, a chip carrier is joined to a board whereby the chip carrier has an electrical mesh plane for heating adjacent the solder interconnection. Resistive heat is generated within this electrical heating component either by applying an electrical current to the electrical heating component, or by noncontact inductively heating the layer in which such electrical heating component resides to generate resistive heat within the electrical heating component. The resistive heat is transferred to the solder interconnection to allow for localized melting of the solder interconnection and removal of the electronic components from one another.

20 Claims, 3 Drawing Sheets

METHOD FOR SEPARATING ELECTRONIC COMPONENT FROM ORGANIC BOARD

BACKGROUND OF THE INVENTION

1. Field of the Invention

The present invention relates to electronic devices, and in particular, to removable and reworkable encapsulated integrated circuit chips and the method of manufacture.

2. Description of Related Art

Surface mount technology (SMT) is a known fabrication process in the microelectronics industry. SMT generally involves forming electronic package assemblies whereby an electrical component, such as an integrated circuit chip, is electrically and mechanically connected to a substrate, a card (i.e., board), another chip or another electronic part.

In one particular application, to which this application is directed to for convenience, multilayer glass-ceramic components, as exemplified by integrated circuit chips on ceramic chip carriers, are joined to printed circuit boards (cards) and/or organic substrates. Often, these multilayer glass-ceramic electronic components are joined to other components by solder interconnections, such as C4 technology or flip chip packaging, or BGA (Ball Grid Array) interconnections, whereby these solder interconnections are made from soldering pads on a surface of a first of these electronic components to corresponding soldering pads on the surface of the second component.

Typical solder surface mount processes involve screening solder paste onto exposed metallic pads of a board or substrate, followed by reflow to bring the solder into spherical shapes. Alternately, solder preforms may be attached to exposed metallic pads by means of flux of solder paste. The reflowed solder or solder ball structure is aligned to corresponding pads on another component, and then the entire assembly is reflowed to melt the solder and create a solder bond between the first and second components. This solder interconnection may be in the form of a ball grid array (BGA), a column grid array (CGA) or a land grid array (LGA).

However, once the solder interconnections are completed, the components may need to be detached from one another. Microelectronics fabrication processes often require disassembly of assembled components, for example, to carry out diagnostic tests, to replace or repair the semiconductor device, to upgrade components, or to recover electrically good substrates from test vehicles or early user hardware used to assess product performance and reliability prior to actual product release.

Removal processes for various assembly materials must be selective for a particular material and cause no detriment to the substrate integrity and electrical performance. It is also required that the removal method be environmentally and chemically suitable for use in a manufacturing environment.

Current approaches for removing electrical components, such as modules containing integrated circuit chips, from organic boards include removal by hot gas. In these hot gas methods, a stream of heated gas, such as $N_2$ or other inert gases, is delivered onto or directed at the electrical component attached to the board via a nozzle. Additional bias heat may be applied via a heating block or heating unit located at the backside of the board to supplement the other thermal inputs.

In these hot gas approaches, heat is transferred through the module and heats up the entire electrical assembly to heat components including, but not limited to, the solder interconnections, lids, heat sinks, chips, underfills, capacitors, and the like. The heat generated at the solder interconnection joining the electrical components to the board liquefies the solder joints allowing such electrical components to be removed from the organic board for rework.

However, by externally applying heat to the electrical component, and optionally the underside of the organic board, certain components within the assembly may be undesirably heated beyond their sustainable temperatures. This external heat may also lead to local hot spots across the board since the hot gas is directed locally on the module that needs to be removed there from. Locally applied heat can also lead to warpage of the organic board as a result of the non-uniform heating of such board. This is undesirable as any board warpage may require that the board be scrapped, along with several other good modules/passives/devices on the board. Further adding to the problems associated with warpage is the placement of heater blocks, or heating units, at the backside of the board as they often interfere with the requirement of holding the board firm and flat. The above problems only get worse as the board size and thickness increase, or when removing large electrical components for rework, such as those having high thermal masses.

Wherein the solder interconnections are lead free solder interconnects, these interconnection schemes generally require the use of higher temperatures during reflow attachment, and even higher temperatures for rework processing. The higher rework temperatures for near eutectic and eutectic lead free solder alloys (Sn/Ag, Sn/Ag/Cu, Sn/Cu), typically range from about 217° C. to about 227° C., and may be higher for hyper-eutectic compositions of the foregoing alloys, such as at temperatures above 227° C. or greater. Yet, these higher rework temperatures for lead free solders can irreparably damage the organic board, and as such, rework of lead free alloy containing assemblies has become a critical issue in the qualification of this technology.

Therefore, a need continues to exist in the art for providing improved methods and structures for the rework of electronic assemblies, and in particular for the removal of electronic components joined to organic boards by solder interconnections for their subsequent use and re-use in integrated circuit fabrication processing.

SUMMARY OF THE INVENTION

Bearing in mind the problems and deficiencies of the prior art, it is therefore an object of the present invention to provide a method for separating electronic components joined by solder connections and, in particular, lead-free solder connections in a BGA or CGA interconnect assembly such as a chip joined to a printed circuit board.

It is another object of the present invention to provide an apparatus for separating electronic components joined by solder connections and, in particular, joined together by lead-free solders in BGA or CGA interconnect assemblies such as a chip joined to a printed circuit board, without adversely affecting the electrical performance of the module.

A further object of the invention is to provide an electronic component substrate and/or assembly reworked using the method and apparatus of the invention.

Still other objects and advantages of the invention will in part be obvious and will in part be apparent from the specification.

The above and other objects, which will be apparent to those skilled in art, are achieved in the present invention, which is directed to a method for separating electronic components joined by solder interconnections. The method includes providing a chip carrier joined to a substrate via a solder interconnection, whereby the chip carrier has an electrical heating component with a planar surface adjacent to the solder interconnection. Resistive heat is generated within the electrical heating component, and this resistive heat is transferred to the solder interconnection to allow for localized melting of the solder interconnection and removal of the chip carrier from the substrate without affecting other components residing on the substrate.

In accordance with the invention, the electrical heating component is preferably a mesh plane, which may be either an existing mesh plane or a mesh plane formed within a stack layer of the chip carrier closest to the solder interconnection. The electrical heating component further includes a plurality of input and output power connections residing at an outside perimeter of the chip carrier, and extending from the planar surface of the electrical heating component up to a top surface of the chip carrier. An electrical current is applied to at least one of the input power connections, through the planar surface of the electrical heating component and up at least one of the output power connections. Using this electrical current, the resistive heat is generated within the planar surface of the electrical heating component.

These input and output power connections may have metal pads attached thereto at the top surface of the chip carrier, whereby the electrical current is applied and conducted through such metal pads. A heat sink may be attached to the chip carrier, whereby the electrical current is applied directly to a first side of the heat sink, is directed into the electrical heating component within the chip carrier, and dissipates at a second side of the heat sink.

Optionally, a non-contact inductive heating magnetic field may be applied to a top surface of the chip carrier to generate the resistive heat within the planar surface of the electrical heating component. In this aspect, the electrical heating component may be a mesh plane or a serpentine line. The non-contact inductive heating magnetic field may be an alternating current magnetic field applied at alternating frequencies ranging from about 20 kHz to about 500 MHz.

In another aspect, the invention is directed to a method for separating electronic components joined by solder interconnections. The method includes providing an electronic module joined to a substrate via a solder interconnection. The electronic module has an electrical heating component residing within a layer of the electronic module, whereby this layer is adjacent to the solder interconnection. The layer of the electronic module is inductively heated to generate resistive heat within the electrical heating component. This resistive heat is then transferred to the locations of the solder interconnections to allow for localized melting of such solder interconnections and removal of the electronic module from the substrate. The layer of the electronic module may be a high conductivity metal layer or a high permeability ferromagnetic layer.

In still another aspect, the invention is directed to an electrical structure for separating electronic components joined by solder interconnections. The structure includes a laminate stack having a plurality of stack layers, and a top and bottom surface. Attached to the bottom surface of the laminate stack is a plurality of solder interconnections. The bottom layer of such laminate stack has an electrical heating element that includes an electrical mesh plane residing in close proximity to the bottom surface of the laminate stack, and a plurality of input and output power connections residing at an outside perimeter of the laminate stack and extending from the electrical mesh plane up to the top surface of the laminate stack. The electrical mesh plane contains resistive heat for melting the plurality of solder interconnections attached to the bottom surface of the laminate stack.

BRIEF DESCRIPTION OF THE DRAWINGS

The features of the invention believed to be novel and the elements characteristic of the invention are set forth with particularity in the appended claims. The figures are for illustration purposes only and are not drawn to scale. The invention itself, however, both as to organization and method of operation, may best be understood by reference to the detailed description which follows taken in conjunction with the accompanying drawings in which:

DESCRIPTION OF THE PREFERRED EMBODIMENT(S)

In describing the preferred embodiment of the present invention, reference will be made herein to FIGS. 1A-3C of the drawings in which like numerals refer to like features of the invention.

The present invention provides for the removal and rework of electrical modules joined to a board or substrate via solder interconnections. The invention advantageously uses the electrical design of the electrical module itself to create wiring channels within the package. The wiring channels may use an existing electrical component within the module, or they may modify or add to the existing electrical design of the module. Preferably, the wiring channels use existing mesh planes or slightly modified mesh planes residing within the module. The wiring channels transfer the required levels of electric current to the joint interface adjacent the solder interconnections. This current is used to create Joule heating ($I^2R$) at the joint interface to melt the solder interconnections and allow for removal and rework of the components. In so doing, the wiring channels advantageously transfer the thermal energy to the exact locations where it is needed (i.e., the solder joints), thereby avoiding the undesirable heating of the topside of the module, including the chip, lid, underfill material, thermal grease, lid sealing materials etc., and avoiding heating of the board to excessive temperatures. It should be appreciated that the present invention is suitable for use in a variety of electrical assemblies including, but not limited to, organic packages on a board, i.e. Flip Chip Plastic Ball Grid Array (FCPBGA) packages, silicon chips on a board, ceramic modules, organic modules, chip stacks where one chip is attached to another, and the like.

Figure 1A:
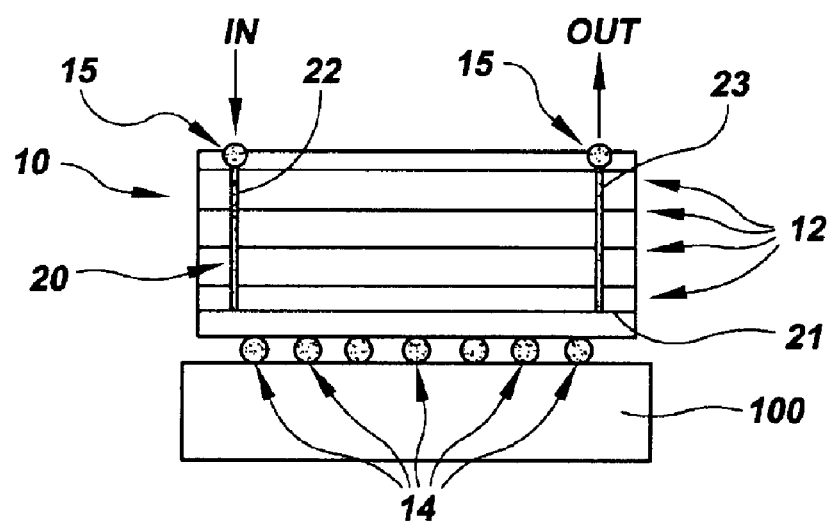
FIG. 1A is a cross sectional side view of an electrical heater element of the invention having a mesh plane within a chip carrier for generating localized heat at a backside module (BSM) interface for removing the chip carrier from a board.
Figure 1B:
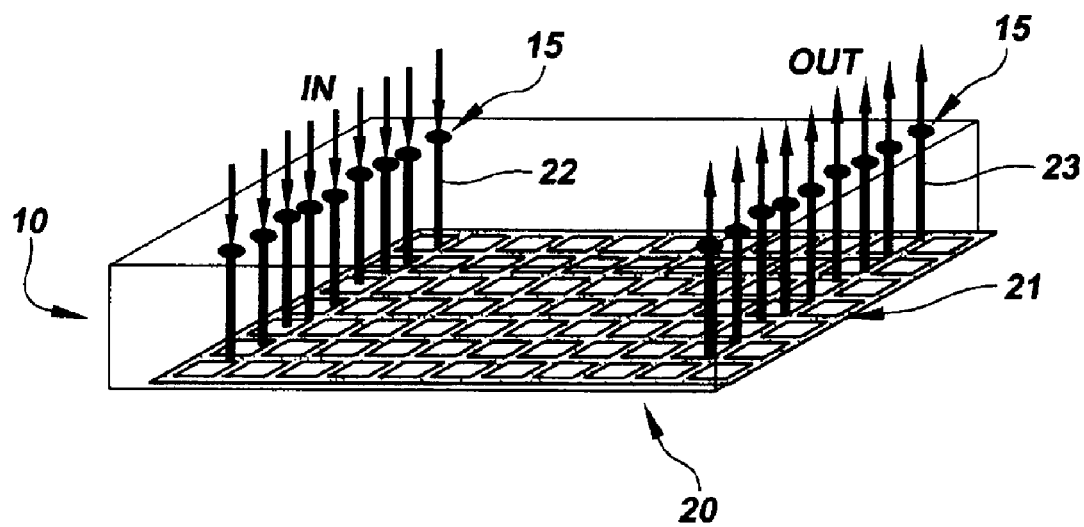
FIG. 1B is a perspective view showing the electrical heater element having the mesh plane of FIG. 1A located near the BSM interconnection.

Referring to FIG. 1A, a cross section of an electrical substrate is shown, such as a chip carrier 10. FIG. 1B shows a perspective view of the electrical substrate of FIG. 1. The chip carrier 10 has a predetermined existing electrical design that includes an electrical mesh 12 residing within the chip carrier 10. Residing at a bottom surface, or backside, of the chip carrier is a plurality of solder joint interconnections 14. These solder joints 14, which are commonly referred to as backside module (BSM) interconnections, reside on I/O connections (i.e., pads) connect the chip carrier 10 to a printed circuit board (card) or an organic substrate 100.

An electrical heater element 20 of the invention is incorporated into the chip carrier 10. This electrical heater element 20 is preferably formed with a planar surface at a backside of the chip carrier 10 such that this planar surface of the heating element 20 is located in close proximity to the plurality of solder joint interconnections 14. Once the heater element is formed, the chip carrier is joined to the board via the BSM interconnections. The heater element 20 is capable of generating Joule heat ($I^2R$) within the chip carrier at the joint interface where the solder connections reside, which in turn, heats and melts the plurality of solder joint interconnections 14. This melting of the solder joint interconnections at their exact locations permits the removal of the chip carrier from the board to allow for rework of such components.

In accordance with the invention, the electrical heater element 20 includes a bottom mesh plane 21, and at least one input power connection 22 and at least one output power connection 23. Preferably, the electrical heater element 20 includes a plurality of input and output power connections 22, 23 for redundancy. The mesh plane 21 is composed of a plurality of parallel and perpendicular lines, and may include any known mesh plane including, but not limited to, a ground, a power plane, a shielding structure, embedded decoupling capacitor, and combinations thereof. This mesh plane 21 is planar with the bottom surface of the chip carrier 10 and is in close proximity to the joint interface where the solder connections reside. The power connections traverse through the chip carrier such that they contact the mesh plane 21 at a first end and contact a top surface of the chip carrier at a second end.

The electrical heater element 20 may be formed within a laminate stack or it may be integrated with an existing electrical structure of a laminate stack. Wherein the electrical heater element 20 is formed within a laminate stack, a plurality of stacked layers 12 are provided whereby each has a plurality of vertical via openings filled with metallization therein. At least one of these stack layers has a mesh plane 21 formed therein with the plurality of vertical via openings filled with metallization connecting the mesh plane to a top surface of such stack layer. The mesh plane 21 is formed using known materials, patterns (parallel and perpendicular lines), and dimensions as may be required by the particular IC design.

Alternatively, an existing electrical mesh plane 21 within a stack layer may be used to form the heater element of the invention. In this aspect, a plurality of vertical via openings are formed within such stack layer to contact and expose the existing electrical mesh plane. These openings are then filled with metallization. In so doing, the selected existing electrical mesh structure 12 is converted from a single use structure, i.e., for its intended purpose (e.g., ground or power plane, or Electro Magnetic Interference (EMI) shield), into a dual use structure, i.e. for its intended purpose in addition to performing the Joule heating task of the invention.

A critical feature of the invention is the use of the mesh plane 21 of the present heater element 20. In accordance with the invention, the mesh plane 21 is preferable since it is advantageously fault tolerant due to its many parallel and perpendicular lines, as compared to serpentine lines which are not fault tolerant. For instance, in a serpentine line, which is a continuous, meandering single line, if a break occurs at any point along such line, the break renders the serpentine line incapable of conducting current. However, since a mesh plane 21 comprises a plurality of parallel and perpendicular lines, if a break occurs at any point within the mesh plane, there are still several other remaining pathways for conducting current, and thus generating the heating of the invention. The mesh plane also advantageously has an insignificant impact on module performance since it does not interfere with other components within the chip carrier. This is particularly the case where the chip carrier has a number of mesh planes, whereby the selected mesh plane 21 of the heater element is aligned in the x-y direction with the other meshes, and therefore, is transparent to the signal and power wire vias that penetrate the chip carrier. Further, the use of an existing mesh plane advantageously avoids the need for any additional metallization within the chip carrier, which could adversely affect electrical performance of such chip carrier, and increase the fabrication cost of the module.

Whether the electrical mesh plane 21 of the heater element 20 is fabricated within a stack layer or integrated with an existing electrical structure of a stack layer, these plurality of stack layers 12 are then laminated to one another using Multi Layer Ceramic (MLC) or organic laminate chip carrier methods to form a laminate stack or the resultant chip carrier 10. The laminate stack (chip carrier 10) includes the plurality of vertical filled vias aligned to one another, and the stack layer having the mesh plane 21 residing at a bottom thereof. In this manner, the stack layer having the mesh plane 21 is adjacent to the solder joint interface connection 14 so that the mesh plane 21 within such stack layer will be in close proximity to such solder joint interface connection.

In accordance with the invention, the filled via openings are formed at the outside perimeter of each stack layer, such that when the plurality of stack layers are joined together, the aligned via openings reside on an outside perimeter of the resultant chip carrier. Upon completion of the resultant chip carrier, these aligned via openings form the input and output power connections 22, 23 of the heater element, which both physically and electrically connect the mesh plane 21 up to the top surface of the chip carrier 10. By forming the input and output power connections 22, 23 at the perimeter of the chip carrier, the heater element advantageously does not interfere with any hierarchy on the chip carrier such as, for example, chips, decoupling capacitors, etc.

Connected to the ends of the input and output power connections 22, 23 at a top surface of the chip carrier are metallization contacts 15, such as I/O metallic pads, for making electrical contact between the electrical heater element 20 within the chip carrier 10 and an electrical power source, or with a heat sink, as discussed further below. That is, the metallization contacts 15 may be exposed at a top surface of the chip carrier, or they may interface with a heat sink design to permit heating in accordance with the invention. These metallization contacts 15 are preferably larger in diameter than the via input and output power connections 22, 23 with which they make contact.

Once the electrical heater element 20 is formed, an electrical current is provided from a top surface of the chip carrier 10, preferably through at least one of the metal contacts 15, into at least one of the input power connections 22 of the electrical heater element 20. The electrical current runs through the electrical heater element by running down the input power connection 22, into and through the mesh plane 21 to generate resistive Joule heating ($I^2R$) in such mesh portion, up a corresponding at least one output power connection 23, and exits the heater element 20 at a top surface of the chip carrier, through the metal contact 15. A plurality of these input and output power connections 22, 23 are provided on opposing sides of the mesh plane to provide redundancy in the event there is a break in any point along the mesh plane. It is also not necessary for these input, output power connections 22, 23 to be located at a junction within the mesh plane 21 since the electrical connection can be received at any point within or location along such mesh plane.

In accordance with the resistive heating of the invention, the heat in the mesh plane 21 is generated adjacent to the solder interface such that the Joule heating ($I^2R$) is transferred from the heater element 20 through the chip carrier, to the I/O connections or pads, and then to the plurality of solder joint interconnections 14. In so doing, the heater element 20 heats the I/O connections or pads internally, i.e., from within the chip carrier, whereby once heated, the heated I/O connections heat the solder joint interconnections. Once the solder joint interconnections reach their melting points, the chip carrier can be removed from the board for rework purposes. Optionally, a relatively low bias heat may be applied to the board to enhance the melting of the solder joints, and as such the removal of the chip from the board, while avoiding the risk of excessive board warpage due to local hot spots.

Figure 2A:
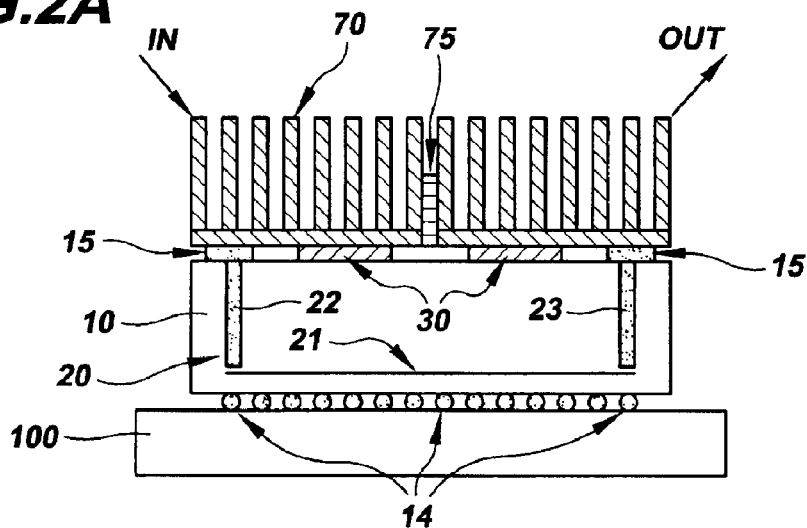
FIG. 2A is a cross sectional side view of the invention showing a heating element within a chip carrier having a plurality of chips residing on the chip carrier, and a heat sink with a centrally located isolating gap.
Figure 2B:
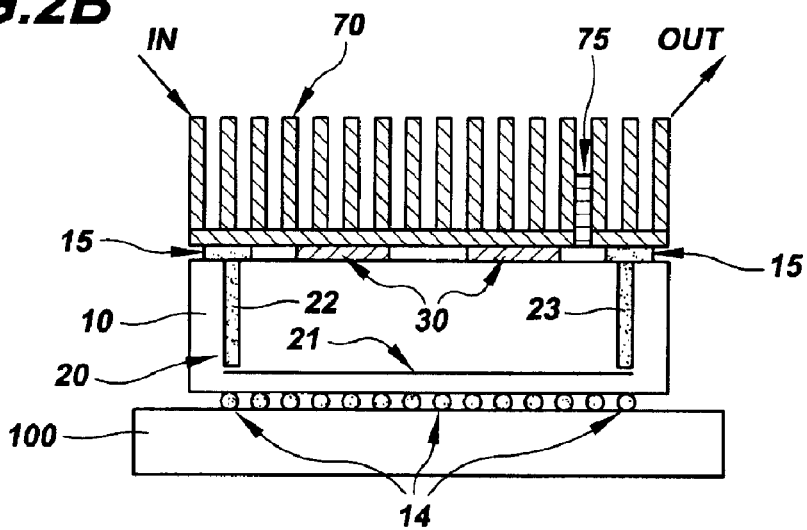
FIG. 2B is a cross sectional side view of the invention showing a heating element within a chip carrier having a plurality of chips residing on the chip carrier, and a heat sink with an off-set located isolating gap.
Figure 2C:
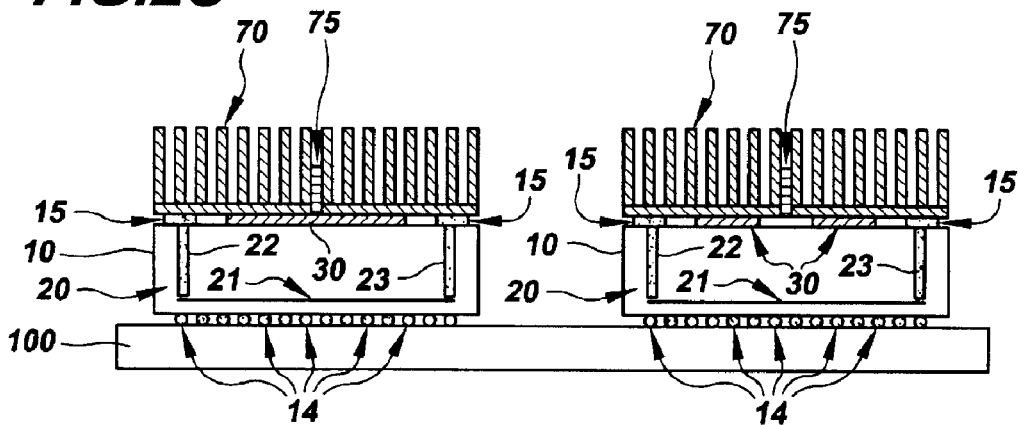
FIG. 2C is a cross sectional side view of the invention showing a heating element within a chip carrier having multiple modules residing on the chip carrier.

Referring to FIGS. 2A-C, a heat sink or lid 70 may optionally be electrically joined to the top surface of the chip carrier 10 having one or a plurality of chips 30 residing thereon for heating the heating element 20 of the invention. Preferably, the heat sink is connected to the metallized pads 15 residing on the chip carrier surface for making such electrical connection. The heat sink 70 includes two sides that are electrically isolated from one another by an electrical insulating gap structure 75. This electrical insulating gap structure 75 permits power to be applied from a first side of the heat sink, through the corresponding metallization 15, down into at least one of the input power connections 22, through the mesh plane 21 to generate resistive heat therein, up a corresponding output power connection 23, out the metallization 15 connected to the corresponding output power connection 23, and into a second side of the heat sink for dissipating generated heat and/or power. Thus, the insulating gap structure 75 electrically isolates the first side of the heat sink from the second side of the heat sink. In this aspect, an electrical connection is made from an electrical source wired directly to the heat sink 70, preferably on an outside perimeter thereof, for providing electrical continuity to the heat sink.

In accordance with the invention, heating the electronic module through the lid is advantageous, particularly in dual or multi module scenarios as shown in FIG. 2B, as a desired chip carrier 10 can be removed from the board 100 without affecting other chip carriers residing on such board. That is, if it is desired that a particular module residing on a board be removed, such as for rework or replacement purposes, the heating element of the invention incorporated within the particular module is heated from the top of such module without heating any adjacent modules. This is accomplished by providing an electrical current either through the heat sink 70, into the metallization 15 and into the heating element within the chip carrier, or wherein the module does not include a heat sink, through the metallization 15 and into the heating element. By heating the heating element 20 through the top of the module, the heat is locally directed to only the solder joint interconnection 14 of the targeted module for removing the chip carrier from the board without deleteriously impacting any neighboring modules. Optionally, a relatively low pre-bias temperature may simultaneously be applied to the board to assist in removal of the chip from such board. This pre-bias temperature is low enough, such that when applied alone to the board, it does not deleteriously affect the modules or other components residing on the board.

Figure 3A:
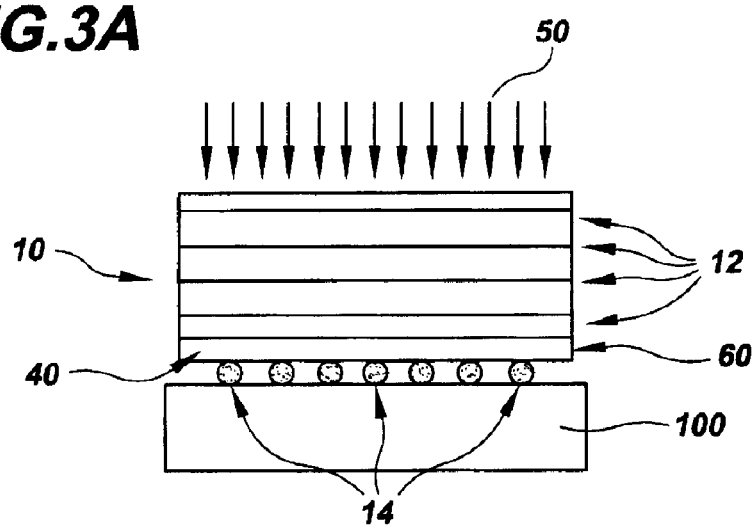
FIG. 3A is a cross sectional side view of an alternate embodiment of the invention for non-contact heating an electrical heating component to generate localized heat at a backside module (BSM) interface for removing a chip carrier from a board.
Figure 3B:
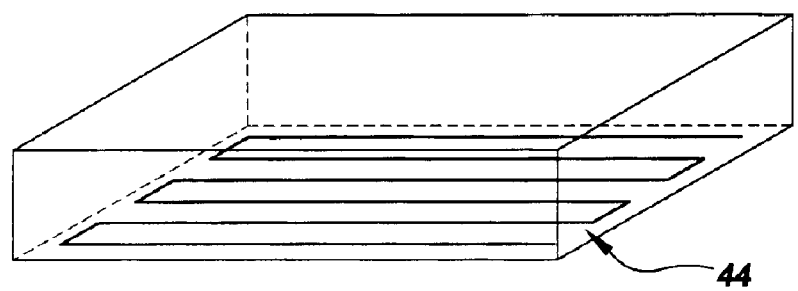
FIG. 3B is a cross sectional side view of FIG. 3A showing the electrical heating component as a serpentine line.
Figure 3C:
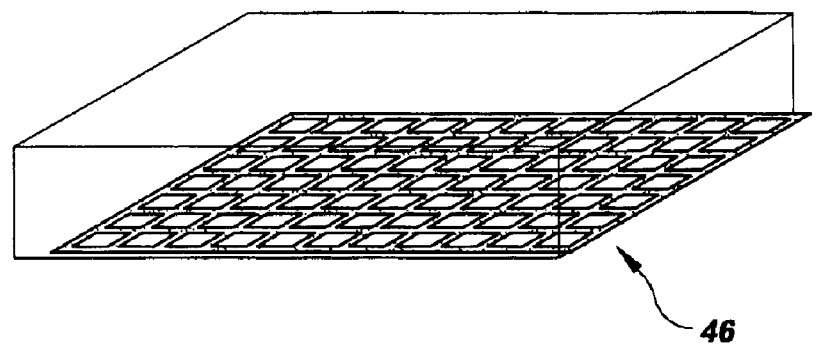
FIG. 3C is a cross sectional side view of FIG. 3A showing the electrical heating component as a mesh plane.

Alternatively, rather than generating resistive heating within the mesh plane of the present heater element through the input and output power connections 22, 23, the Joule heating ($I^2R$) of the invention may be generated by a non-contact approach. Referring to FIGS. 3A-3C, Joule heating ($I^2R$) may be generated using a non-contact magnetic field 50 in combination with an electrical heating component 40. In this aspect, the electrical heating component 40 may be a serpentine line 44 as shown in FIG. 3B, or it may be a mesh plane 46 as shown in FIG. 3C.

As discussed above, the electrical heating component 40 may be either an existing heating component residing within a stack layer, or it may be formed within a stack layer. Once the stack layers are joined together, the stack layer having the electrical heating component 40 is preferably at the bottom of the laminated stack, such that the electrical heating component 40 is in close proximity to the solder joint interconnection 14.

The non-contact magnetic field 50 is preferably an alternating current (AC) magnetic field, or some type of inductive heating, applied to the top surface of the chip carrier 10, which penetrates through the chip carrier. In this non-contact approach, the stack layer 60 in which the electrical heating component 40 resides preferably resonates at a frequency ranging from about 10 mHz to about 500 mHz. For example, the stack layer 60 having the electrical heating component 40 may be a closed loop of conductors having a total length of a half wavelength in the chip carrier ($\lambda/2$) that resonates at a frequency ranging from about 10 mHz to about 500 mHz. When an AC magnetic field is applied to the chip carrier at a frequency ranging from about 10 mHz to about 500 mHz, this applied energy is transferred (coupled) down into the stack layer having the electrical heating component such that this stack layer resonates and generates an electrical current. The electrical current is transferred into the electrical heating component 40 for generating the resistive heating (i.e., Joule heating ($I^2R$)) of the invention therein. The heat generated in the electrical heating component 40 is transferred to the plurality of solder joint interconnections 14 for the melting thereof, thereby allowing for the removal of the chip carrier 10 from the board 100.

This non-contact heating approach of the invention is particularly useful for stack layers composed of high conductivity metals including, but not limited to, copper, molybdenum, tungsten or any other metal that resonates at applied frequencies ranging from about 10 mHz to about 500 mHz. Alternatively, the stack layer 60 having the electrical heating component 40 may be composed of a high permeability ferromagnetic material including, but not limited to, iron, iron-alloys, or any other ferromagnetic material. The high permeability ferromagnetic stack layer 60 uses the losses associated with the penetrating AC magnetic field in combination with a frequency that minimizes the shielding provided by any electrically active copper layers residing within the chip carrier to generate the electrical current. The electrical current is transferred to the electrical heating component 40 to generate the resistive heat therein, which is transferred through the high permeability layer 60 and to the solder joints for the melting thereof. The frequency may range from about 20 kHz to about 500 kHz.

Advantageously, the present invention delivers Joule heating generated from within the substrate to locations where it is needed, and in particular, directly to the solder joints. In so doing, excessive heating of the board is avoided, as well as avoiding any substantial heating of the components residing on the topside of the module. The additional wiring of the invention is also compatible with the general chip carrier electrical wiring design as it takes into account such electrical characteristics, and as such, avoids any violation of specific ground rules for performance and production. Since the heat is applied locally to the desired solder interface, without affecting other components on the chip and/or board (e.g., other modules, passives, capacitor, etc.), the invention easily allows for the reclamation of these components for rework purposes including, but not limited to, engineering changes, diagnostic purposes, etc. In view of the foregoing description of the invention, the minimum spacing between two adjacent modules or components may be increased as the heat is applied from within the substrate to the solder joints, thereby allowing for greater density (more real estate) on the board.

While the present invention has been particularly described, in conjunction with a specific preferred embodiment, it is evident that many alternatives, modifications and variations will be apparent to those skilled in the art in light of the foregoing description. It is therefore contemplated that the appended claims will embrace any such alternatives, modifications and variations as falling within the true scope and spirit of the present invention.

What is claimed is:

1. A method for separating electronic components joined by solder interconnections comprising:

providing a chip carrier joined to a substrate via a solder interconnection, said chip carrier having an electrical heating component with a planar surface adjacent to said solder interconnection, said electrical heating component comprising a mesh plane with a plurality of input power connections and a plurality of corresponding output power connections extending from said planar surface of said electrical heating component up to a top surface of said chip carrier;

generating resistive heat within said electrical heating component by running an electrical current along said plurality of input power connections and out said plurality of corresponding output power connections; and transferring said resistive heat to said solder interconnection to allow for localized melting of said solder interconnection and removal of said chip carrier from said substrate without affecting other components residing on said substrate.

2. The method of claim 1 wherein an electrical heating power comprising an AC source with a frequency that resonates with the chip carrier is applied to said chip carrier in a selective manner such that said chip carrier resonates and generates an electrical current, which is transferred into said electrical heating component for generating said resistive heating.

3. The method of claim 1 wherein said mesh plane comprises an existing mesh plane within a stack layer of said chip carrier closest to said solder interconnection, said existing mesh plane being converted into a dual use mesh plane.

4. The method of claim 1 wherein said plurality of input and output power connections reside at an outside perimeter of said chip carrier.

5. The method of claim 1 further including the steps of:

applying an electrical current to at least one of said input power connections, through said planar surface of said electrical heating component and up at least one of said output power connections; and generating said resistive heat within said planar surface of said electrical heating component using said electrical current.

6. The method of claim 5 further including said plurality of input and output power connections having a plurality of metal pads attached thereto at said top surface of said chip carrier, whereby said electrical current is applied directly to said metal pad of said at least one of said input power connections and dissipates at said metal pad of said at least one of said output power connections.

7. The method of claim 1 further including applying a bias temperature to said substrate to enhance said localized melting of said solder interconnection, whereby said bias temperature alone substantially avoids any risk of damage to said substrate.

8. The method of claim 1 further including the steps of:

applying a non-contact inductive heating magnetic field to a top surface of said chip carrier; and generating resistive heat within said planar surface of said electrical heating component using said non-contact inductive heating magnetic field or coupled RF energy into said resonate heating structure.

9. The method of claim 8 wherein said non-contact inductive heating magnetic field comprises an alternating current magnetic field.

10. The method of claim 9 wherein said alternating current magnetic field is applied at alternating frequencies ranging from about 10 mHz to about 500 mHz.

11. A method for separating electronic components joined by solder interconnections comprising:

providing a chip carrier joined to a substrate via a solder interconnection, said chip carrier having an electrical heating component with a planar surface adjacent to said solder interconnection, said electrical heating component comprising a mesh plane with a plurality of input power connections and corresponding output power connections extending from said planar surface of said electrical heating component up to a top surface of said chip carrier;

generating resistive heat within said electrical heating by applying an electrical current to at least one of said input power connections, through said planar surface of said electrical heating component, and up at least one of said output power connections; and transferring said resistive heat to said solder interconnection to allow for localized melting of said solder interconnection and removal of said chip carrier from said substrate without affecting other components residing on said substrate.
said chip carrier having a heat sink attached thereto, whereby said electrical current is applied directly to a first side of said heat sink, is directed into said electrical heating component within said chip carrier, and dissipates at a second side of said heat sink.

12. The method of claim 11 wherein said heat sink includes an electrical insulating structure for electrically isolating said first side of said heat sink from said second side of said heat sink.

13. A method for separating electronic components joined by solder interconnections comprising:
providing a chip carrier joined to a substrate via a solder interconnection, said chip carrier having an electrical heating component with a planar surface adjacent to said solder interconnection;
attaching a heat sink to said chip carrier, said heat sink having a first side and a second side;
applying an electrical current to said first side of said heat sink and into said electrical heating component to generate resistive heat within said electrical heating component;
transferring said resistive heat to said solder interconnection to allow for localized melting of said solder interconnection and removal of said chip carrier from said substrate without affecting other components residing on said substrate; and
dissipating said resistive heat at said second side of said heat sink.

14. The method of claim 13 wherein said electrical heating component has an input power connection and a corresponding output power connection extending from said planar surface of said electrical heating component up to a top surface of said chip carrier, said electrical current being applied into said input power connection and out through said output power connection to generate said resistive heat within said electrical heating component.

15. The method of claim 13 further including said electrical heating component having a plurality of input power connections and a plurality of corresponding output power connections extending from said planar surface of said electrical heating component up to said top surface of said chip carrier.

16. The method of claim 15 wherein said plurality of input and output power connections reside at an outside perimeter of said chip carrier.

17. The method of claim 13 wherein said electrical heating component comprises a mesh plane.

18. The method of claim 13 wherein said electrical heating component comprises a serpentine line.

19. The method of claim 13 wherein said heat sink includes an electrical insulating structure for electrically isolating said first side of said heat sink from said second side of said heat sink.

20. The method of claim 13 further including the steps of:
applying a non-contact inductive heating magnetic field to a top surface of said chip carrier; and
generating resistive heat within said planar surface of said electrical heating component using said non-contact inductive heating magnetic field or coupled RF energy into said resonate heating structure.

* * * * *